United States Patent [19]

Peterson et al.

[11] Patent Number: 4,951,740
[45] Date of Patent: Aug. 28, 1990

[54] BELLOWS HEAT PIPE FOR THERMAL CONTROL OF ELECTRONIC COMPONENTS

[75] Inventors: George P. Peterson, College Station, Tex.; Sevgin Oktay, Poughkeepsie, N.Y.

[73] Assignee: Texas A & M University System, The College Station, Tex.

[21] Appl. No.: 211,571

[22] Filed: Jun. 27, 1988

[51] Int. Cl.$^5$ .................... E28D 15/02; F28F 27/00; H01L 23/427

[52] U.S. Cl. ...................... 165/32; 165/46; 165/80.4; 165/104.26; 165/104.33; 361/385

[58] Field of Search ................ 165/32, 104.33, 80.4, 165/80.2, 46, 104.26; 361/385

[56] References Cited

U.S. PATENT DOCUMENTS

| | | | |
|---|---|---|---|
| 3,800,190 | 3/1974 | Marek . | |
| 3,822,743 | 7/1974 | Waters . | |
| 3,852,805 | 12/1974 | Brzozowski . | |
| 3,957,107 | 5/1976 | Altoz et al. | 165/32 |
| 4,138,692 | 2/1979 | Meeker et al. | 165/80.4 |
| 4,212,349 | 7/1980 | Andros et al. . | |
| 4,274,476 | 6/1981 | Garret | 165/32 |
| 4,313,492 | 2/1982 | Andros et al. | 165/104.26 |
| 4,402,358 | 9/1983 | Wolf | 165/32 |
| 4,561,040 | 12/1985 | Eastman et al. . | |

FOREIGN PATENT DOCUMENTS

| | | | |
|---|---|---|---|
| 24369 | 2/1977 | Japan | 165/104.26 |
| 151068 | 1/1985 | World Int. Prop. O. . | |
| 156546 | 1/1985 | World Int. Prop. O. . | |

OTHER PUBLICATIONS

Moran et al., Self-Regulating Evaporative/Conductive Thermal Link, IBM Technical Disclosure Bulletin, vol. 21, No. 8, Jan., 1979.
Buller et al., Thermally Enhanced Self Leveling/Positive Contact Substrate Cap, IBM Technical Disclosure Bulletin, vol. 23, No. 3, Jul., 1980.
Gokhale et al., Module Heat Pipe Cooling Structure, IBM Technical Disclosure Bulletin, vol. 22, No. 1, Jun., 1979.
Oktay et al., Compliant Heat Pipe for Cooling Semiconductors, IBM Technical Disclosure Bulletin, vol. 22, No. 3, Aug., 1979.
Greer et al., Modified Bellows Conductive Cooling, IBM Technical Disclosure Bulletin, vol. 20, No. 11A, Apr., 1978.
Berndlmaier et al., Chip Packaging Structure with Enhanced Cooling, IBM Technical Disclosure Bulletin, vol. 20, No. 5, Oct., 1977.
Yarlott, J. M., Thermal Conduction Module Cooling, IBM Technical Disclosure Bulletin, vol. 26, No. 2, July, 1983.
Kleinfelder et al., Liquid-Filled Bellows Heat Sink, IBM Technical Disclosure Bulletin, vol. 21, No. 10, March, 1979.
Clark et al., Cooling Device for Multilayer Ceramic Modules, IBM Technical Disclosure Bulletin, vol. 20, No. 5, Oct., 1977.

*Primary Examiner*—Davis, Jr. Albert W.
*Attorney, Agent, or Firm*—Arnold, White & Durkee

[57] ABSTRACT

A bellows type heat pipe which conducts heat away from an electronic device to a heat sink. The heat pipe is a sealed bellows type container which has an evaporator section at one end and a condenser section at an opposite end. The evaporator section contains a saturated radial wick while the condenser section is lined with a radial wick and a circumferential wick. A corrugated slab wick is longitudinally disposed within the heat pipe interconnecting the evaporator and the condenser sections. The evaporator section is placed on the electronic device and the condenser section is enclosed in a housing which is connected to a heat sink. In operation, the electronic device generates heat energy which causes the fluid in the evaporator to vaporize building a vapor pressure in the heat pipe. The heat pipe expands in the direction of the condenser causing the condenser section to make intimate contact with the inside of the housing. The vapors condense at the condenser section and are brought back to the evaporator section via the circumferential wick, the walls of the bellows vessel and the wick slab.

13 Claims, 3 Drawing Sheets

BELLOWS HEAT PIPE FOR THERMAL CONTROL OF ELECTRONIC COMPONENTS

BACKGROUND OF THE INVENTION

The invention relates generally to heat transfer control apparatus and more particularly to a bellows type heat pipe for conducting heat away from electronic components.

The use of heat pipes for transferring heat energy from a higher temperature body to a lower temperature body are well known in the art. U.S. Pat. Nos. 4.402,358, 4,212,349, 4,561,040, 3,957,107, 4,313,492, 4,402.358, 3,822,743, 3,957,107 and 4,274,476 are examples of the state of the art heat pipes.

Integrated circuits (chips) are the most widely used electronic components. The chip manufacturers specify the maximum operating temperature of these devices, which is very nearly the upper limit at which a given device is capable of operating reliably. However, most devices work most efficiently at temperatures well below their specified maximum operating temperature. Thus, it is desirable to maintain the operating temperatures of these devices at values below their maximum operating temperatures. Heat pipes are therefore commonly used to transfer heat from a chip to a heat sink which is maintained at a temperature considerably below the temperature of the device.

It is highly desirable that a heat pipe for an electronic component operate efficiently. The heat pipe should be capable of conducting heat energy away from the electronic component rapidly. Unfortunately, the heat pipes being used presently are lacking in efficiency, and there exists a need for more efficient heat pipes. It is, accordingly, a general object of the present invention to provide a more efficient heat pipe for conducting heat away from electronic components including integrated circuits and the like.

SUMMARY OF THE INVENTION

In a general aspect, the present invention comprises a bellows type heat pipe for conducting heat away from electronic components. The heat pipe includes an enclosed bellows type heat pipe having a condenser section at its upper end and an evaporator section at its lower end. The evaporator section contains a volatile fluid and is lined with a wick which spreads the fluid and prevents isolated hot spots in the evaporation. The condenser section is lined with a circumferential and a radial wick to condense the vapors and to help prevent the condenser section from becoming an insulator due to the presence of noncondensable gases inside the heat pipe. A flexible wick structure is longitudinaly disposed within the heat pipe to act as a capillary from the condenser to the evaporator and to compensate for the expansion and contraction of the bellows structure.

The heat pipe may be constructed for use on a single electronic component or as a multiple bellows heat pipe having a common condenser for use on a plurality of electronic components.

Examples of the more important features of this invention have thus been summarized rather broadly in order that the detailed description thereof that follows may be better understood, and in order that the contribution of the art may be better appreciated. There are, of course, additional features of the invention that will be described hereinafter and which will also form the subject of the claims appended hereto.

BRIEF DESCRIPTIONS OF THE DRAWINGS

The foregoing and other features and advantages of the present invention will become more apparent in the following description of a preferred embodiment, in connection with the accompanying drawings wherein like reference numerals have been applied to like elements.

DESCRIPTION OF PREFERRED EMBODIMENT

The system of the invention comprises an enclosed bellows type heat pipe for conducting away heat from a heat source to a heat sink which is maintained at a temperature considerably below the temperature of the heat source. The enclosed heat pipe includes a bellows type vessel with an evaporator section and a condenser section at its opposite ends. The heat pipe is sealed to contain volatile working fluid. The condenser section is lined inside with a circumferential wick and a radial wick. A wick structure is longitudinally disposed within the heat pipe to act as a capillary. The heat pipe is enclosed in a housing which is attached to a cold plate or another suitable member which acts as a heat sink. The evaporator end of the heat pipe is maintained in contact with the heat source, an electronic chip, which when hot causes the working fluid to evaporate thereby building vapor pressure in the heat pipe and causing the bellows vessel to expand in the direction of the heat sink. Heat exchange between the heat source and the heat sink occurs when the pipe expands sufficiently to make contact with the housing.

Figure 1:
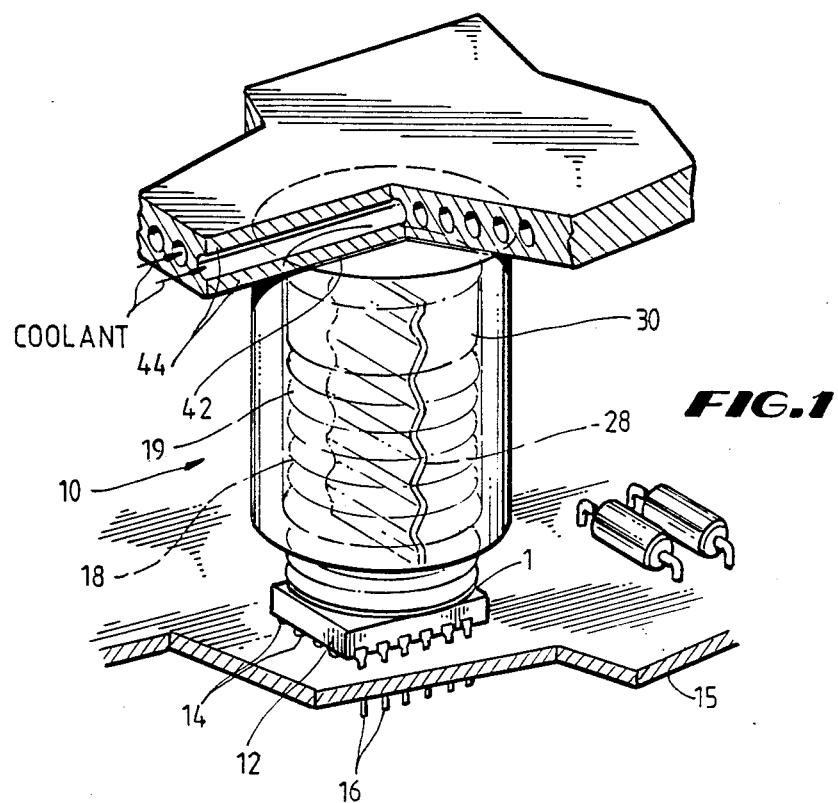
FIG. 1 is an isometric view of heat pipe of the invention placed on an electronic device and partially enclosed in a housing which is attached to a cold plate.
Figure 2A:
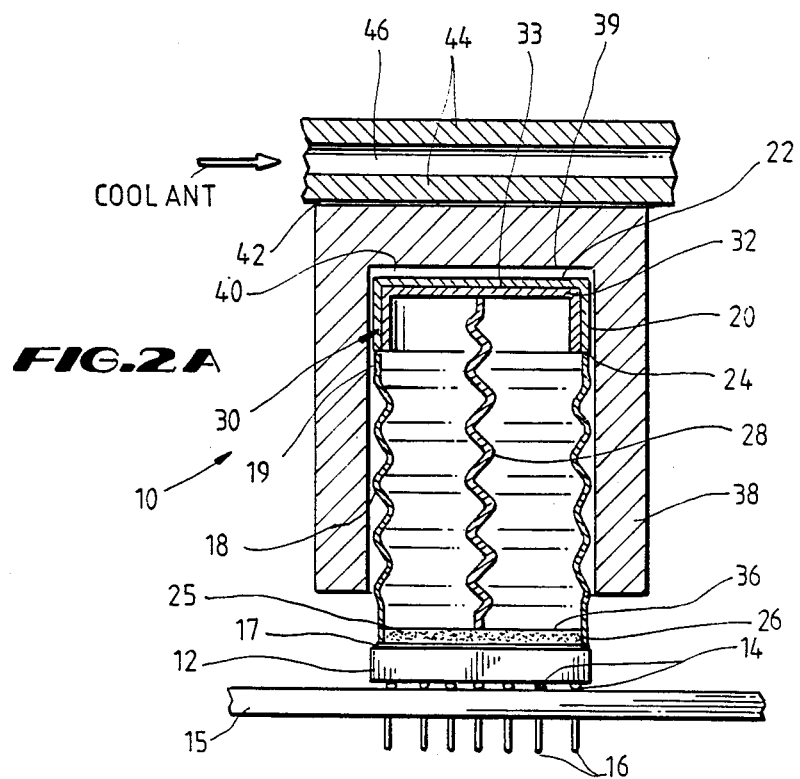
FIG. 2A is a cross section taken along AA in FIG. 1 which illustrates the heat pipe enclosed in the housing when the on-off plate of the heat pipe is not in contact with the housing.
Figure 2:
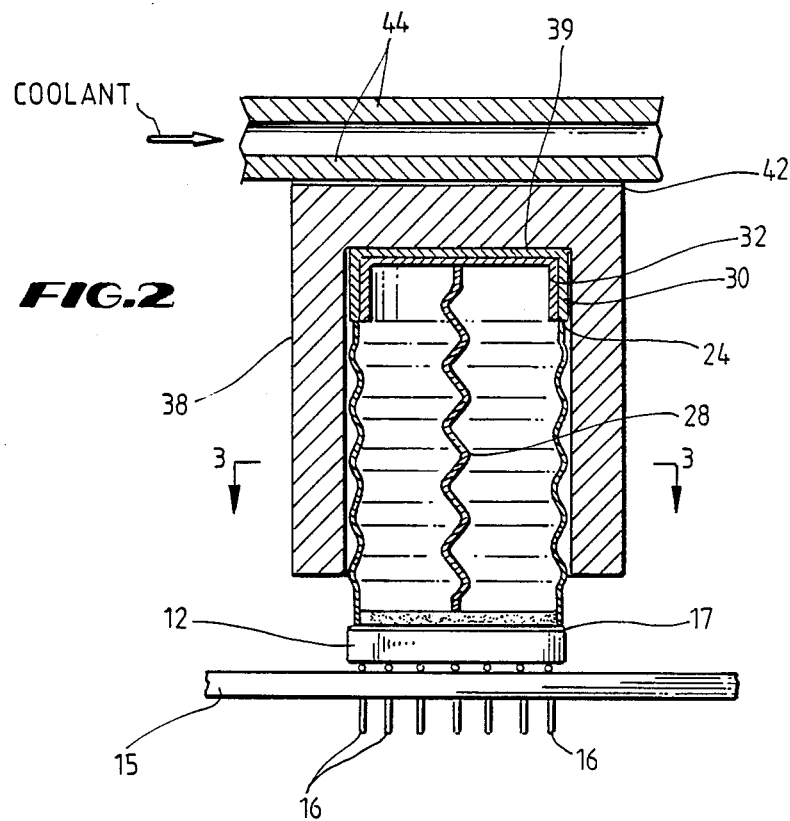
FIG. 2B is a cross section taken along AA of FIG. 1 which illustrates the heat pipe enclosed in the housing when the on-off plate of the heat pipe is in contact with the housing.

FIG. 1, in an isometric view, illustrates a single heat pipe module 10, which includes a heat pipe 19 placed on an electronic chip 12 and enclosed in a housing 38. The housing 38 is attached to a cold plate 44 containing a plurality of through channels for circulating a coolant therethrough.

Referring to FIG. 1A, the heat pipe thermal conduction module or simply the heat pipe 19 is shown to contain a cylindrical bellows type vessel 18 whose bottom evaporator end, generally flat, is in contact with the top surface of an electronic device, also generally flat, through a layer of thermal epoxy 17. The electronic device is normally placed on a substrate 15, like a printed circuit-board, through a plurality of solder bumps 14 to make proper electrical contact with predetermined points on the printed circuit board.

The bellows type vessel 18 is generally made of a copper, although other materials which have high thermal conduction properties may also be used. The walls of the bellows vessel are thin enough so that the heat pipe is flexible along its longitudinal axis. The inside 25 of the bottom surface of the bellows vessel 18 is lined with a wick 26 which is saturated with a working fluid 36 such as ammonia, water, etc. to form a reservoir. The wick 26 spreads fluid 36 evenly throughout the reservoir which prevents the formation of hot spots along the inside of the bottom end and also enhances the evaporation of the fluid when the electronic component 12 generates heat. The bottom portion of the bellows vessel is referred to as the evaporator section. Wicks of the screen mesh, metal fiber, sintered powder or sintered fiber type, etc. may be used in the evaporator section.

A hollow cylindrical condenser 20 having a generally flat outer surface is sealingly attached (e.g. by brazing) to the top end 24 of the bellows vessel. The entire inner surface of the condenser 20 is lined with a circumferential wick 30 and a radial wick 32. It will be noted that a single wick capable of lining the inner surfaces of the condenser may be used instead of wicks 30 and 32. The heat pipe 19 is thus an air-tight (sealed) chamber having an evaporator section at the bottom end and a condenser section at the top end. The top outer surface 22 of the condenser 20 is referred to as the on-off plate.

A corrugated wick slab 28 of rectangular cross-section is longitudinally disposed in the heat pipe. This wick slab 28 is flexible and is connected to the wicks 26 and 32 or to the evaporator and condenser sections themselves so that it can expand and contract as the bellows vessel expands and contracts. It is essential to use a longitudinal wick structure to serve as a capillary especially when the heat pipe is used in horizontal or slanted configurations (not shown). A longitudinally disposed wick greatly improves the efficiency of the heat pipe by rapidly moving the condensed fluid at the condenser surface to the reservoir for re-evaporation and also enables one to use a relatively small amount of fluid in the reservoir. The system of the heat pipe when used in a horizontal position will not work properly without the presence of a capillary member like a wick. Further, in certain application it has been found that a corrugated slab type wick enables the system to operate more efficiently than other types of structures such as a circumferential wick.

The heat pipe 19 is enclosed in a chamber or a housing 38. The outer surface 42 of the housing 38 is secured to a cold plate 44. Cooling fluid, e.g. water, maintained at a temperature sufficiently below the temperature of the device 12 is circulated through channels 46 in the cold plate to enable the cold plate to act as a heat sink. When the heat pipe is not conducting heat from the source 12 to the heat sink 44, there exists an air gap 40 between the on-off plate 22 and the inside 39 of the housing 38.

In operation, the evaporator end of the heat pipe is placed on a device like a semiconductor chip 12, which is to be maintained below a certain temperature. When the device is under operation, it produces internal heat. Most commercial electronic chips have a maximum operating temperature of about 85° C. However, under certain operating conditions, the actual temperature of the chip may be well above its maximum operating temperature. The chip dissipates a portion of its thermal energy through the thermal epoxy 17 to the lower (bottom) end 25 of the bellows vessel 18. The heat energy evaporates (vaporizes) the fluid in the evaporator section of the heat pipe causing a vapor pressure to be built inside the bellows vessel thereby expanding it in the direction of the condenser section. When sufficient vapor pressure has been built, the on-off plate 22 will make contact with the inside surface 39 of the housing 38 as illustrated in FIG. 1B. The contact of the heat pipe to the housing creates a direct heat conduction path from the electronic device 12 to the cold plate 44. When a cold fluid, e.g., water at about 5° C., is circulated through the cold plate 44, the housing will be maintained at a temperature well below the temperature of the device and the on-off plate. The cold plate 44 in conjunction with the housing 38 forms a heat sink. When the on-off plate 44 is in contact with the housing, it forms a relatively cold end of the heat pipe causing condensation to occur at the inner surface 33 of the condenser section. The condensed fluid then flows back down to the evaporator via the corrugated slab wick 28, the circumferential wick 30 and the inside walls of the bellows vessel 18. The fluid then evaporates again to repeat the expansion and condensation cycle.

Once the device 12 has cooled a predetermined amount, vaporization of the working fluid 36 is no longer adequate to expand the bellows vessel 18 sufficiently to maintain intimate contact between the on-off plate 22 and the housing surface 39 thereby reestablishing an air gap between the on-off plate and the housing. The heat pipe as described above functions as a thermal switch to efficiently conduct heat from the heat source 12 to the heat sink 44.

An increase in the temperature of the electronic device 12 results in an increase in the vapor pressure inside the heat pipe 19 which increases the pressure exerted on the contacting surfaces of the heat pipe (on-off plate) 22 and the inside surface 39 of the housing 38. This, in turn, reduces the thermal contact resistance at that interface and improves the efficiency of the system. The use of a bellows type vessel, itself, when compared to solid piston type heat pipes, also greatly reduces the thermal resistance between the chip surface and the heat pipe. The inherent flexibility of the bellows vessel also compensates for improper alignment between the condenser 20 and the inside surface 39 of the housing 38.

Figure 3:
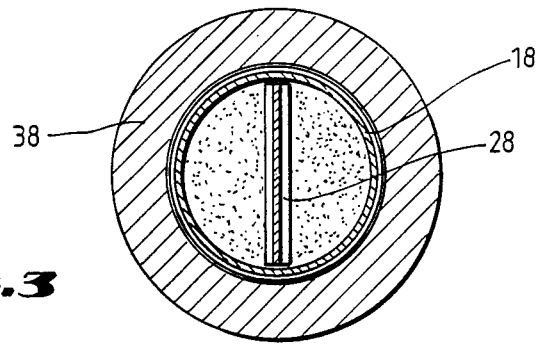
FIG. 3 is a cross-sectional view of the heat pipe taken along BB of FIG. 1 which depicts the cross sections of the circumferential wick and the corrugated slab wick.

The use of radial wick 32 in the condenser section aids in dispersing the condensed fluid to the circumferential wick 30 and the longitudinally disposed slab wick 28. In the absence of a circumferential wick 30, the non-condensable gases get trapped around the periphery of the radial wick 32 causing the condenser section to act as a heat insulator, this inhibits further condensation of the vapors and reduces the efficiency of the heat pipe considerably. As noted earlier, the slab wick used in the heat pipe of the instant invention extends from the evaporator section to the condenser section. As illustrated in FIG. 3, this wick is rectangular in cross section but is preferably corrugated to help compensate for the expansion and contraction of the bellows vessel.

The device of the invention may be used as a thermal switch, not only to cool electronic devices, but also to insure that the temperature of an electronic device does not fall below a predetermined temperature. The device may also be used in larger configurations as a flexible thermal contact for electronic equipment. Further, by varying the spring constant of the bellows vessel, the heat pipe may be used to interface with chips of different electrical power levels to the same cold plate.

Thus far, the device has been described for use in applications where it is not necessary to maintain a constant conduction path between the device 12 and the heat sink 44. When it is desirable to maintain a constant conduction path, the on-off plate 22 may be fixedly attached to the inside 39 of the housing 38 or directly to the cold plate 44. This configuration reduces thermal resistance between the heat source and the heat sink. To further reduce the thermal resistance, the evaporator section may be fixedly attached (e.g. by soldering) to the electronic device 12.

Figure 4:
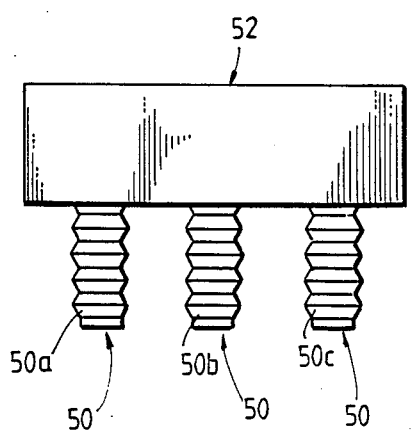
FIG. 4 illustrates, in a front view, a heat pipe structure having multiple bellows vessels and a common condenser section.

FIGS. 4-7 illustrate the use of heat pipes of the instant invention to control the temperature of multiple chips. FIG. 4 illustrates a plurality of bellows vessels 50a-50c connected to a common condenser section 52. The common condenser section is a container having a closed upper end and a bottom end with multiple openings. A separate bellows vessel having an evaporator section at one end is sealingly attached to each opening in the condenser section 52 to form a multiple bellows heat pipe.

Figure 6:
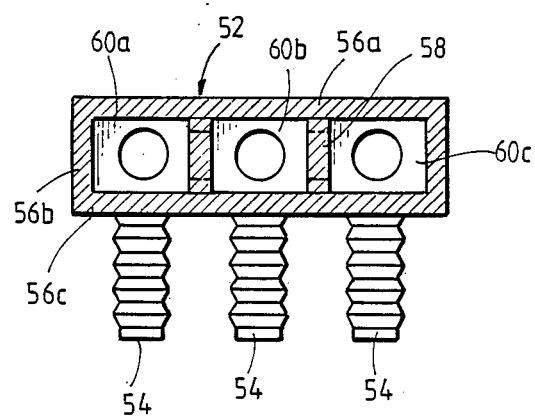
FIG. 6 is a cross-sectional view of the device of FIG. 5 taken along AA.
Figure 5:
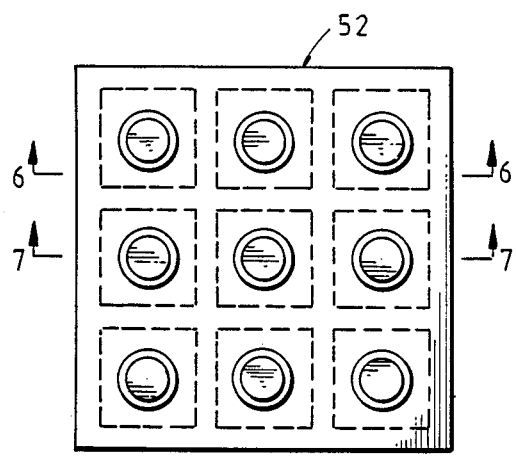
FIG. 5 is the bottom view of the device of FIG. 4.
Figure 7:
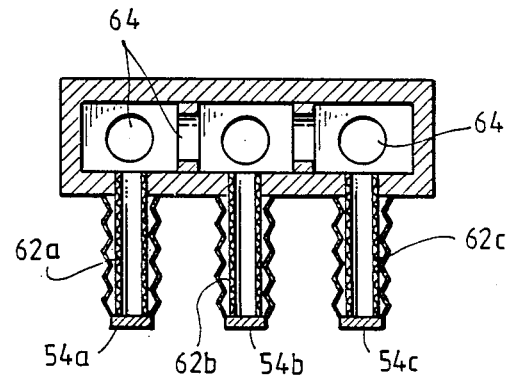
FIG. 7 is a cross-sectional view of the device of FIG. 5 taken along BB.

Referring now to FIG. 6, the condenser section is lined along its entire inner surface with a wick 56. Each bellows vessel has its corresponding condenser section. For example, bellows vessel 50a has a corresponding condenser section 60a. Wicks 58 separate each condenser subsection 60a-60c. Each condenser subsection is interconnected by holes 60 and 62 to allow the vapor pressure in the entire condenser section 52 to equalize, which enables a uniform longitudinal movement of the condenser section 52. Wicks 58 aid the condensed fluid to flow back toward the bottom portion 56c of wick 56. Wicks 56b and 58 serve the function of a circumferential wick of a single heat pipe structure as illustrated in FIG. 1A and described earlier. A longitudinal wick 62 is disposed within each bellows section and is connected to wick 54 in its evaporator section 26 and to the bottom portion of wick 56 in the common condenser section 52. The wick 62a-c are illustrated as being circumferential type wicks. A corrugated wick slab may be used instead.

In operation, one bellows section is placed on a chip while the condenser section 52 is either disposed in a housing attached to a heat sink wherein there exists an air gap for the heat pipe to act as a switch or the common condenser section 52 is connected to a heat sink to form a continuous heat conduction path between the chips and the heat sink. The operation of a multi-bellows heat pipe is similar to the operation of a single bellows heat pipe described hereinabove.

The foregoing description has been directed to particular embodiments of the invention for the purposes of illustration and explanation. It will be apparent, however, to those skilled in this art that many modifications and changes in the embodiments set forth will be possible without departing from the scope and spirit of the invention. It is intended that the following claims be interpreted to embrace all such modifications and changes.

What is claimed is:

1. A heat transfer device which comprises a closed cylindrical container including a flexible bellows member with an evaporator section at one end and a condenser section at an opposite end, a first wick lining said evaporator section, a second wick lining said condenser section, and a flexible corrugated slab-type wick longitudinally disposed within the cylindrical container interconnecting said evaporator section and said condenser section.

2. The device of claim 1 wherein and said bellows member is made from copper.

3. A heat transfer device comprising a close hollow cylindrical flexible bellows member adapted to contain a working fluid; a separate end cap sealingly attached to each opposite end of the bellows member, one end cap defining an evaporator section and the other end cap defining a condenser section; a first wick lining said evaporator section; a second wick lining said condenser section; and a flexible corrugated slab-type wick interconnecting said first and second wicks.

4. A heat transfer device, which comprises:
    (a) a flexible cylindrical bellows member having an open end and a closed end with a flat outer surface, said closed end defining an evaporator section which is adapted to contain a body of fluid therein;
    (b) a first wick lining said evaporator section;
    (c) a rigid cylindrical member having an open end and a closed end with a flat outer surface, the open end of the cylindrical member sealingly attached to the open end of the bellows member to form a sealed container, said rigid cylindrical member defining a condenser section;
    (d) a second wick completely lining the inside of the condenser section; and
    (e) a flexible corrugated slab-type wick longitudinally disposed within the sealed flexible container, said flexible corrugated slab-type wick interconnecting said first and second wicks.

5. Apparatus for conducting heat away from an electronic device, which comprises:
    (a) a heat pipe comprising a flexible bellows member terminating in an evaporator section at one end and a condenser section at an opposite end, a first wick lining said evaporator section; a second wick lining said condenser section, and a flexible wick longitudinally disposed within said flexible bellows member and interconnecting said first and second wicks;
    (b) said evaporator section adapted to be placed on an electronic device capable of generating heat energy when operating and causing said fluid to vaporize thereby building vapor pressure in said heat pipe and expanding it in the direction of the condenser section;
    (c) a housing enclosing said condenser section so as to leave an air gap between said condenser and said housing when said electronic device is not generating heat energy; and
    (d) a heat sink attached to said housing for conducting heat away from said electronic device.

6. The device as defined in claim 5 wherein said heat sink comprises a cold plate with a through channel for circulating a body of a cold fluid therethrough.

7. Apparatus for conducting heat away from an electronic device, which comprises:
    (a) a heat pipe comprising a flexible bellows member defining to an evaporator section at one end and a condenser section at an opposite end, a first wick lining the evaporator section and containing a fluid, a second wick lining the condenser section, and a longitudinally disposed flexible corrugated slab-type wick within said flexible bellows member and interconnected to said first and second wicks;

(b) said evaporator section adapted to be placed on an electronic device characterized by generating heat when operating sufficient to cause a fluid within the evaporator section to vaporize; and (c) said condenser section of said heat pipe attached to a heat sink means.

8. The device as defined in claim 7 wherein said heat sink comprises a cold plate with a through channel for circulating a cold fluid therethrough.

9. Apparatus of claim 7 wherein said evaporator section is permanently cemented on said electronic device.

10. Apparatus of claim 7 wherein said evaporator section is soldered on said electronic device.

11. Apparatus of claim 7 wherein said condenser section has an inner circumferential wall and a flat inside and a flat outside surface.

12. Apparatus of claim 11 wherein said second wick comprises a radial wick which lines the flat inside surface of the condenser section and a circumferential wick which lines the inner circumferential walls of the condenser section.

13. Apparatus for transferring heat from an electronic device to a heat sink, said electronic device generating heat energy when operating, said apparatus comprising:

(a) a cylindrical heat pipe comprising:

(i) an evaporator section and a condenser section sealingly attached to opposite ends of a hollow flexible bellows member to form a sealed flexible container;

(ii) a first wick saturated with a fluid lining the evaporator section;

(iii) a second wick completely lining the condenser section; and (iv) a flexible corrugated slab wick longitudinally disposed within the sealed flexible container and attached to said first and second wicks;

(b) said evaporator section of the heat pipe adapted to be placed on said electronic device via a layer of a thermal epoxy, the heat energy from the electronic device when operating vaporizing the fluid in the evaporator section and causing vapor pressure to be built in the heat pipe so as to expand the heat pipe in the direction of the condenser section;

(c) a housing enclosing said condenser section while providing a gap of predetermined width between the housing and the condenser section when the electronic device is not generating said heat energy; and (d) a cold plate attached to said housing, said cold plate having channels there through for circulating a cold fluid, said cold plate acting as the heat sink.

* * * * *

UNITED STATES PATENT AND TRADEMARK OFFICE
CERTIFICATE OF CORRECTION

PATENT NO. : 4,951,740

DATED : August 28, 1990

INVENTOR(S) : Peterson etal.

It is certified that error appears in the above-identified patent and that said Letters Patent is hereby corrected as shown below:

Col.6, line 4, Claim 2, between the words "wherein" and "said" please delete the word "and".

Signed and Sealed this

Eighth Day of December, 1992

Attest:

*Attesting Officer*

DOUGLAS B. COMER

*Acting Commissioner of Patents and Trademarks*